US008343386B2

(12) United States Patent
Bandy, IV et al.

(10) Patent No.: US 8,343,386 B2
(45) Date of Patent: Jan. 1, 2013

(54) ELECTROSTATIC DISSIPATIVE ADHESIVE

(75) Inventors: William Thomas Bandy, IV, Fremont, CA (US); Icko E. Tim Iben, Santa Clara, CA (US); Wayne Alan McKinley, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 559 days.

(21) Appl. No.: 12/125,012

(22) Filed: May 21, 2008

(65) Prior Publication Data

US 2009/0289231 A1 Nov. 26, 2009

(51) Int. Cl.
*H01B 5/14* (2006.01)
*H01B 1/00* (2006.01)
*H01L 23/28* (2006.01)
*H01R 11/01* (2006.01)

(52) U.S. Cl. .................... 252/518.1; 252/500; 252/502; 252/506; 252/510; 252/511; 252/519.3; 252/519.33; 257/E21.521; 257/E23.075; 428/32.1; 428/688

(58) Field of Classification Search .......... 252/500–511, 252/518.1, 519.3, 519.33; 257/E21.521, 257/E23.075; 428/32.1, 688
See application file for complete search history.

(56) References Cited

U.S. PATENT DOCUMENTS 5,670,251 A * 9/1997 Difrancesco .................. 428/325
6,353,268 B1 * 3/2002 Cobbley et al. ............... 257/796
6,468,376 B2 10/2002 Biskeborn et al. ............ 156/228
6,867,241 B2 * 3/2005 Wojciak et al. ................ 522/12
6,870,717 B2 3/2005 Childress et al.
7,223,922 B2 5/2007 Bandy, IV et al. ............ 174/254
7,230,805 B2 6/2007 Childress et al.
7,247,588 B2 7/2007 Kwon et al. .................. 501/105
7,274,536 B2 9/2007 Deshpande et al. ....... 360/234.7
7,764,466 B2 7/2010 Kawai et al.
2003/0180508 A1 * 9/2003 McArdle et al. ........... 428/195.1
2003/0214763 A1 11/2003 Childress et al.
2005/0122634 A1 6/2005 Childress et al.
2005/0168874 A1 8/2005 Biskeborn et al.
2005/0274455 A1 * 12/2005 Extrand ..................... 156/272.4
2006/0035087 A1 * 2/2006 Yadav et al. ............... 428/411.1
2007/0084043 A1 * 4/2007 Hosking ......................... 29/621
(Continued)

OTHER PUBLICATIONS

Wentite website: http://www.wentite.com: Loctite 380—May 4, Loctite 4303—Aug. 2000; Loctite 4302—May 2000; Loctite 4205—May 2004.*

(Continued)

*Primary Examiner* — Mark Kopec
*Assistant Examiner* — Tri V Nguyen
(74) *Attorney, Agent, or Firm* — Zilka-Kotab, PC

(57) ABSTRACT

An electrostatically dissipative adhesive in one embodiment includes a mixture comprising: an adhesive material; and electrically conductive particles intermixed with the adhesive material, the electrically conductive particles being present in an amount between 0 and about 10% by weight of a total weight of the mixture. An electrostatically dissipative adhesive in another embodiment includes a mixture comprising: an adhesive material; and electrically conductive particles intermixed with the adhesive material, the electrically conductive particles being present in an amount between 0 and about 10% by weight of a total weight of the mixture, wherein the mixture has at least 50% of a lap shear strength as measured in accordance with ISO 4587 after curing for 72 hours at 22° C. as the raw adhesive material has as measured in accordance with ISO 4587 after curing for 72 hours at 22° C.

2 Claims, 8 Drawing Sheets

U.S. PATENT DOCUMENTS

2007/0109683 A1 5/2007 Kawai et al.

OTHER PUBLICATIONS 3M website: http://solutions.3m.com: Scotch weld—Jun. 2000).*
U.S. Appl. No. 11/781,850, filed Jul. 23, 2007.
U.S. Appl. No. 12/125,001, filed May 21, 2008.
Notice of Allowance from U.S. Appl. No. 12/125,001 dated Sep. 27, 2011.
Non-Final Office Action from U.S. Appl. No. 12/125,001 dated Jun. 14, 2011.

* cited by examiner

ELECTROSTATIC DISSIPATIVE ADHESIVE

FIELD OF THE INVENTION

The present invention relates to adhesives and uses thereof, and more particularly, this invention relates to electrostatic dissipative adhesives and use thereof with electronics such as magnetic head structures.

BACKGROUND OF THE INVENTION

Magnetic head-based systems have been widely accepted in the computer industry as a cost-effective form of data storage. In a magnetic tape drive system, a magnetic tape containing a multiplicity of laterally positioned data tracks that extend along the length of the tape is drawn across a magnetic read/write transducer, referred to as a magnetic tape head. The magnetic tape heads can record and read data along the length of the magnetic tape surface as relative movement occurs between the heads and the tape.

In a magnetic disk drive system, a magnetic recording medium in the form of a disk rotates at high speed while a magnetic head “flies” slightly above the surface of the rotating disk. The magnetic disk is rotated by means of a spindle drive motor.

Magnetoresistive (MR) sensors are particularly useful as read elements in magnetic heads, used in the data storage industry for high data recording densities. Three examples of MR materials used in the storage industry are anisotropic magnetoresistive (AMR), giant magnetoresistive (GMR) and tunneling magnetoresistive (TMR). An MR sensor is one whose resistance is changed by a magnetic field. MR, e.g., AMR, GMR and TMR, sensors are deposited as small and thin multi-layered sheet resistors on a structural substrate. The sheet resistors can be coupled to external devices by contact to metal pads which are electrically connected to the sheet resistors. MR sensors provide a high output signal which is not directly related to the head velocity as in the case of inductive read heads.

To achieve the high areal densities required by the data storage industry, the sensors are made with commensurately small dimensions. The smaller the dimensions, the more sensitive the thin film resistors become to damage from spurious current and voltage spikes.

A major problem that is encountered during manufacturing, handling and use of MR sheet resistors as magnetic recording transducers is the buildup of electrostatic charges on the various components of a head or other objects which come into contact with the sensors, particularly sensors of the thin film type, and the accompanying spurious discharge of the static electricity thus generated. Static charges may be externally produced and accumulate on instruments used by persons performing head manufacturing or testing function. These static charges may be discharged through the head, causing physical and/or magnetic damage to the sensors.

As described above, when a head is exposed to voltage or current inputs which are larger than that intended under normal operating conditions, the sensor and other parts of the head may be damaged. This sensitivity to electrical damage is particularly severe for MR read sensors because of their relatively small physical size. For example, an MR sensor used for high recording densities for magnetic tape media (on the order of 25 MBytes/cm$^2$) are patterned as resistive sheets of MR and accompanying materials, and typically have a combined thickness for the sensor sheets on the order of 500 Angstroms (Å) with a width of a few microns (μm) and a height on the order of 1 μm. Sensors used in extant disk drives are even smaller. Discharge currents of tens of milliamps through such a small structure can cause severe damage or complete destruction of the MR sensor. The nature of the damage which may be experienced by an MR sensor varies significantly, including complete destruction of the sensor via melting and evaporation, oxidation of materials at the tape bearing surface (TBS), generation of shorts via electrical breakdown, and milder forms of magnetic or physical damage in which the head performance may be degraded. Short time current or voltage pulses which cause extensive physical damage to a sensor are termed electrostatic discharge (ESD) pulses.

For example, in current full span tape head modules, an insulative adhesive layer is used for bonding a closure to the thin film stack portion of the device chip, which contains the magnetic read, write and servo elements. Thus, the closure and chip are electrically isolated. Usually the chip itself is connected to ground or other reference voltage in the tape drive, leaving the closure floating. Tape running can then lead to significant closure charging resulting in electrical potential difference between substrate and closure of up to 10s of volts. This is known to contribute to such problems as shorting, alumina pitting, accumulation of adherent debris and others. Also, ESD can cause shorting and result in damage of sensors and read-write elements. To prevent closure charging and ESD, an adhesive should be selected that has electrostatic dissipative properties, thus effectively reducing the chance of electrostatic discharge.

There are many applications where devices are bonded together that require a specific adhesive to satisfy bond strength requirements for the particular materials, as well as satisfying other mechanical properties. For example, in current full span tape head modules, an insulative adhesive layer is used for bonding the closure to the thin film stack portion of the device chip, which contains the magnetic read, magnetic write, and magnetic servo transducers. However, this electrically isolates the various portions of the head.

In some cases, an electrical connection is required to connect the devices together. In other cases, the electrical connections require an ESD dissipative connection (about $10^4$ to about $10^{11}$ ohms resistance). An example of such use would be the attachment of conductive ceramics used in tape heads. In tape heads, wafers made of conductive ceramics are used to deposit the read and write elements used to read and write data onto magnetic tapes. In some cases, two or more conductive ceramics are bonded together with a strong adhesive and are then cut and polished to form a smooth TBS. The tape head components are usually not connected electrically. When worn against tape, these conductive materials at the TBS can be charged up due to tribocharging with the tape. Also, the metal material forming the read-write materials are also in contact with the tape and can have a voltage either due to tribocharging of the tape or because of passing electrical charges used in the device operation.

It has been found that it is beneficial to set the potential of the head components to specific values and in some cases to keep all components at the same electrical potential. One solution is to use a silver paint to connect the closure and the substrate together, which is used in IBM's LTO tape drives. While this usually works, there are reliability issues involving the silver paint flaking off as the paint dries. Also, the application of the silver paint to the head components is an additional step in the processing of the head.

Another solution is using a conductive element for clamping the head components at the same electrical potential. This also has reliability issues in that the material used for the bond could get into the elements and cause a short. Also, this adds another processing step in manufacturing the head.

SUMMARY OF THE INVENTION

An electrostatically dissipative adhesive in one embodiment includes a mixture comprising: an adhesive material; and electrically conductive particles intermixed with the adhesive material, the electrically conductive particles being present in an amount between 0 and about 10% by weight of a total weight of the mixture.

An electrostatically dissipative adhesive in another embodiment includes a mixture comprising: an adhesive material; and electrically conductive particles intermixed with the adhesive material, the electrically conductive particles being present in an amount between 0 and about 10% by weight of a total weight of the mixture, wherein the mixture has at least 50% of a lap shear strength as measured in accordance with ISO 4587 after curing for 72 hours at 22° C. as the raw adhesive material has as measured in accordance with ISO 4587 after curing for 72 hours at 22° C.

The embodiments described here may be used in any application where adhesives are useful. For example, any of these embodiments may be implemented in a magnetic data storage system such as a tape drive system, which may include a magnetic head as recited above, a drive mechanism for passing a magnetic medium (e.g., recording tape) over the magnetic head, and a controller electrically coupled to the magnetic head.

Other aspects, advantages and embodiments of the present invention will become apparent from the following detailed description, which, when taken in conjunction with the drawings, illustrate by way of example the principles of the invention.

DETAILED DESCRIPTION

Figure 1:
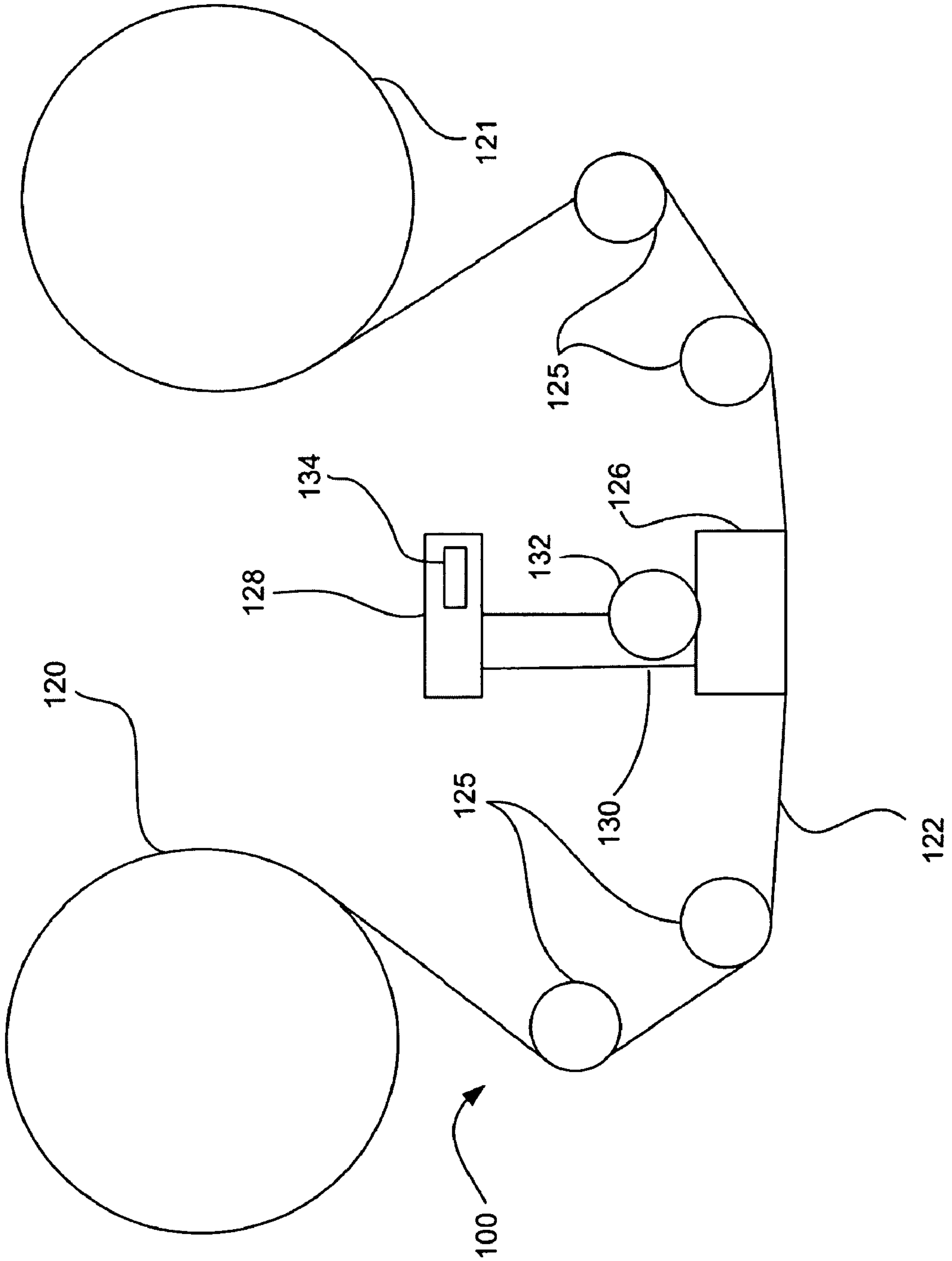
FIG. 1 is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms “a,” “an” and “the” include plural referents unless otherwise specified.

Novel electrostatic dissipative adhesive compositions are described below. Other embodiments described below disclose a new head design that reduces or eliminates electrical potential differences between components of the magnetic head. The following description also discloses several preferred embodiments of tape-based storage systems, as well as operation and/or component parts thereof.

In some embodiments, the choices of adhesives and of the conductivity (resistivity) of the adhesive is limited to, or based on, functionality of systems like those described below. One use of the bonded materials described herein are in conjunction with tape storage products, which are in an open environment, exposed to environmental ranges of temperature and humidity. Furthermore, the sensors embedded within this structure are sensitive to corrosion. Also, accumulation of material on the TBS of levels as low as tens of nm is detrimental to functioning. Finally, motion of the materials at the TBS is very strictly limited. Thus, the choice of adhesive and the conductive additives is preferably chosen with, at least, the following criteria in mind: (1) low outgassing of any kind, but especially corrosive agents (no fluxing agent); (2) strong bond strength of the coupled parts after curing and even after prolonged exposure to humidity, which tends to degrade most adhesives over time; (3) sufficient electrical connections, but, in many cases not too high. For at least one of the systems described below, specific choices of adhesives which met all of the requirements of the system required substantial time and money to find. Thus, one purpose of converting these commercial adhesives to be conductive or to have an electrostatically dissipative conductivity is to substantially maintain all of the other properties associated with the particular adhesive chosen for the particular bond.

In one general embodiment, an electrostatically dissipative adhesive comprises a mixture which includes an adhesive material with electrically conductive particles intermixed therein. The electrically conductive particles are present in an amount between 0% and about 10% by weight of a total weight of the mixture.

In another general embodiment, a system comprises a substrate, a thin film structure coupled to the substrate, with the thin film structure comprising at least one of read transducers and write transducers. The system further includes a closure which defines at least a portion of a tape bearing surface and an electrostatically dissipative adhesive coupling the closure to at least one of the thin film structure and the substrate. The adhesive comprises a mixture which includes an adhesive material with electrically conductive particles intermixed therein. The electrically conductive particles are present in an amount between 0% and about 10% by weight of a total weight of the mixture.

In yet another general embodiment, a system comprises a substrate, a chiplet coupled to the substrate, with the chiplet having a thin film structure comprising at least one of read transducers and write transducers. Also, the system includes an electrostatically dissipative adhesive comprising a mixture coupling the chiplet to the substrate. The mixture comprises an adhesive material with electrically conductive particles intermixed therein. The electrically conductive particles are present in an amount between 0% and about 10% by weight of a total weight of the mixture.

In another general embodiment, a method for fabricating a system comprises coupling a closure, which defines at least a portion of a tape bearing surface, to at least one of a thin film structure and a substrate using an electrostatically dissipative adhesive, with the adhesive comprising a mixture. The mixture comprises an adhesive material with electrically conductive particles intermixed therein. The electrically conductive particles are present in an amount between 0% and about 10% by weight of a total weight of the mixture.

In a further general embodiment, a system comprises a substrate, a thin film structure coupled to the substrate with the thin film structure comprising at least one of read transducers and write transducers, a cable electrically coupled to the thin film structure, and an electrostatically dissipative adhesive overlying the cable near a point of coupling of the cable to the thin film structure. The adhesive comprises a mixture comprising an adhesive material with electrically conductive particles intermixed therein. The electrically conductive particles are present in an amount between 0% and about 10% by weight of a total weight of the mixture. For this bonded system the adhesive system preferably has low outgassing and no corrosive agents (no fluxing agent) and preferably cures at ambient conditions. The adhesive preferably also bonds to the gold plated leads in the cable, and it is beneficial to bond to the cable substrate of polyimid. One particularly preferred adhesive which worked for all of these purposes was Loctite 380. Any conductive additive preferably does not substantially alter these characteristics. The conductivity of the adhesive may be chosen for ESD protection, and is preferably high enough for this purpose while being low enough not to affect the functioning of the sensors which are being shunted together with the dissipative adhesive. As will be described below, conductive particles such as carbon black can be added to the adhesive to give the appropriate conductivity while not substantially degrading the mechanical properties of the adhesive bond.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface may also be provided for communication between the tape drive and a host (integral or external) to send and receive the data and for controlling the operation of the tape drive and communicating the status of the tape drive to the host, all as will be understood by those of skill in the art.

Figure 2:
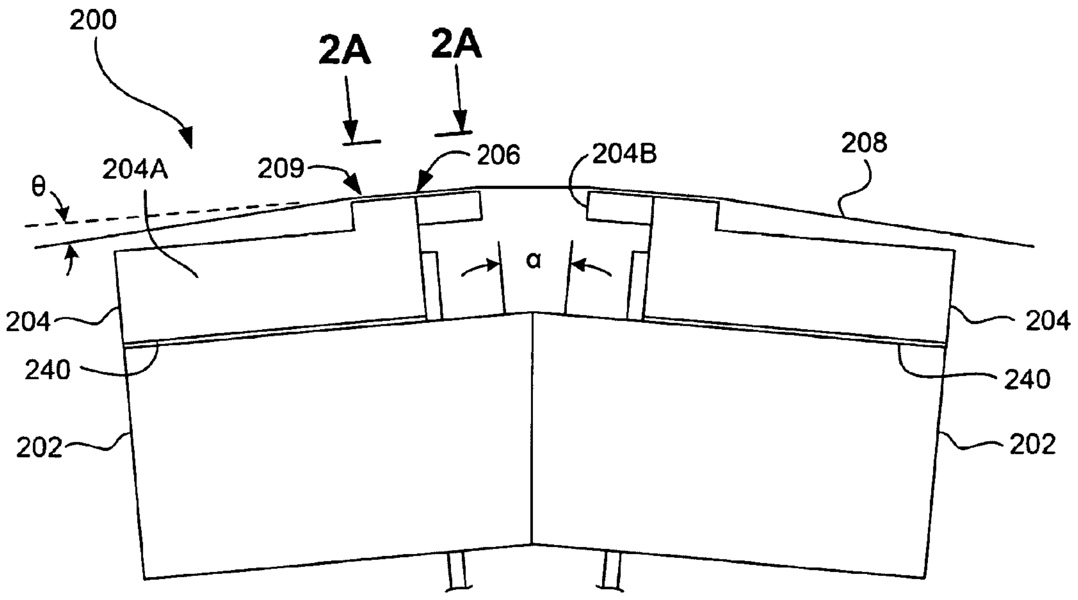
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of modules 204 comprising bases 202 and a chip, and fixed at a small angle α with respect to each other. The bases are typically “U-beams” that are adhesively coupled together. Each chip includes a substrate 204A. A closure 204B is coupled to the substrate 204A with a gap 206 comprising readers and/or writers situated therebetween, usually in a thin film layer. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers.

Figure 2A:
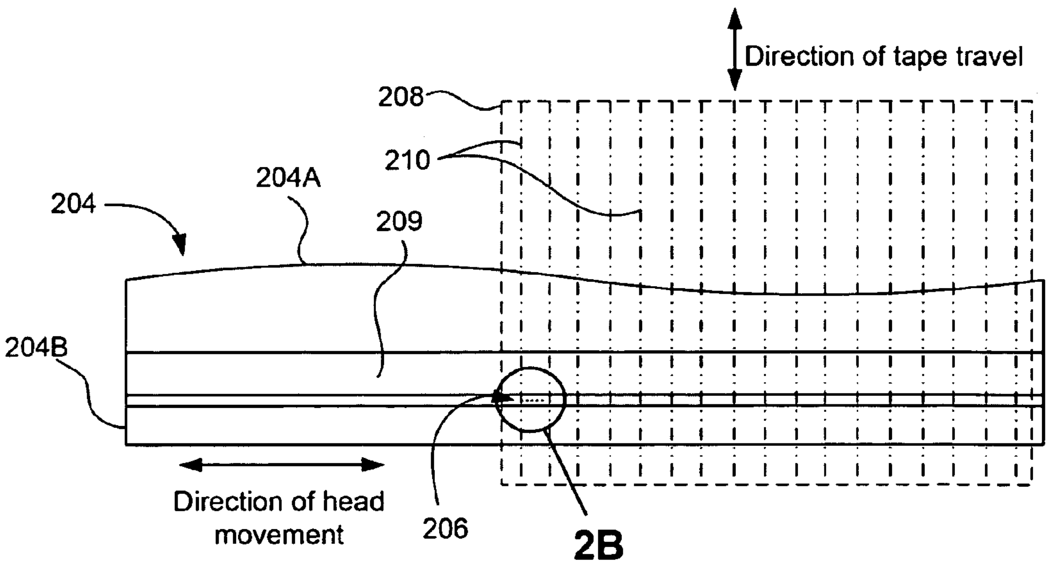
FIG. 2A is a tape bearing surface view taken from Line 2A of FIG. 2.

FIG. 2A illustrates the tape bearing surface (TBS) 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 12-22 data bands, e.g., with 16 data bands and 17 servo tracks 210, as shown in FIG. 2A on a one-half inch wide tape 208. The data bands are defined between servo tracks 210. Each data band may include a number of data tracks, for example 96 data tracks (not shown). During read/write operations, the elements 206 are positioned within one of the data bands. Outer readers, sometimes called servo readers, read the servo tracks 210. The servo signals are in turn used to keep the elements 206 aligned with a particular track during the read/write operations.

Figure 2B:
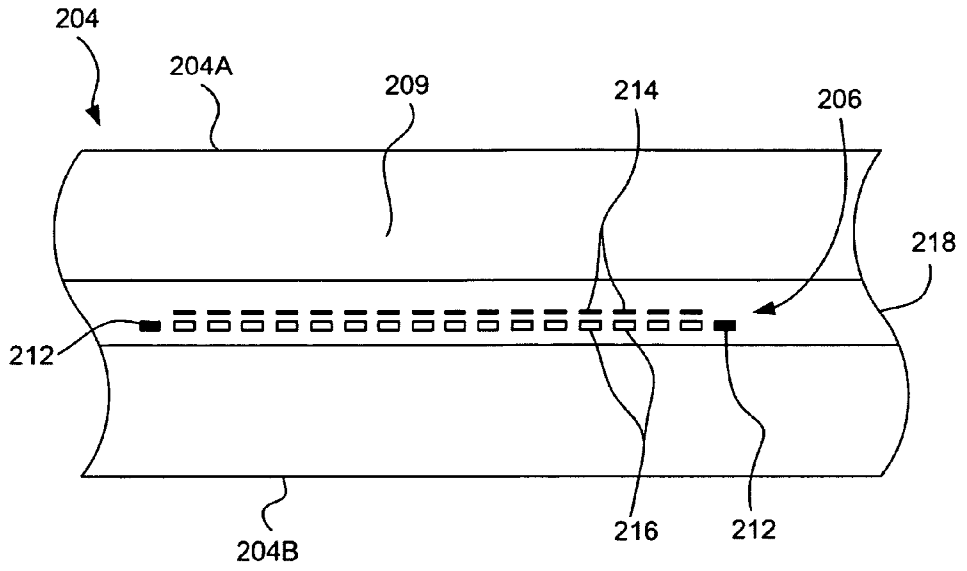
FIG. 2B is a detailed view taken from Circle 2B of FIG. 2A.

FIG. 2B depicts a plurality of read and/or write elements 206 formed in a gap 218 on the module 204 in Circle 2B of FIG. 2A. As shown, the array of elements 206 includes, for example, 16 writers 214, 16 readers 216 and two servo readers 212, though the number of elements may vary. Illustrative embodiments include 8, 16, 32, and 40 elements per array 206. A preferred embodiment includes 32 readers per array and/or 32 writers per array. This allows the tape to travel more slowly, thereby reducing speed-induced tracking and mechanical difficulties. While the readers and writers may be arranged in a piggyback configuration as shown in FIG. 2B, the readers 216 and writers 214 may also be arranged in an interleaved configuration. Alternatively, each array of elements 206 may be readers or writers only, and the arrays may contain one or more servo readers 212. As noted by considering FIGS. 2 and 2A-B together, each module 204 may include a complementary set of elements 206 for such things as bi-directional reading and writing, read-while-write capability, backward compatibility, etc.

Figure 2C:
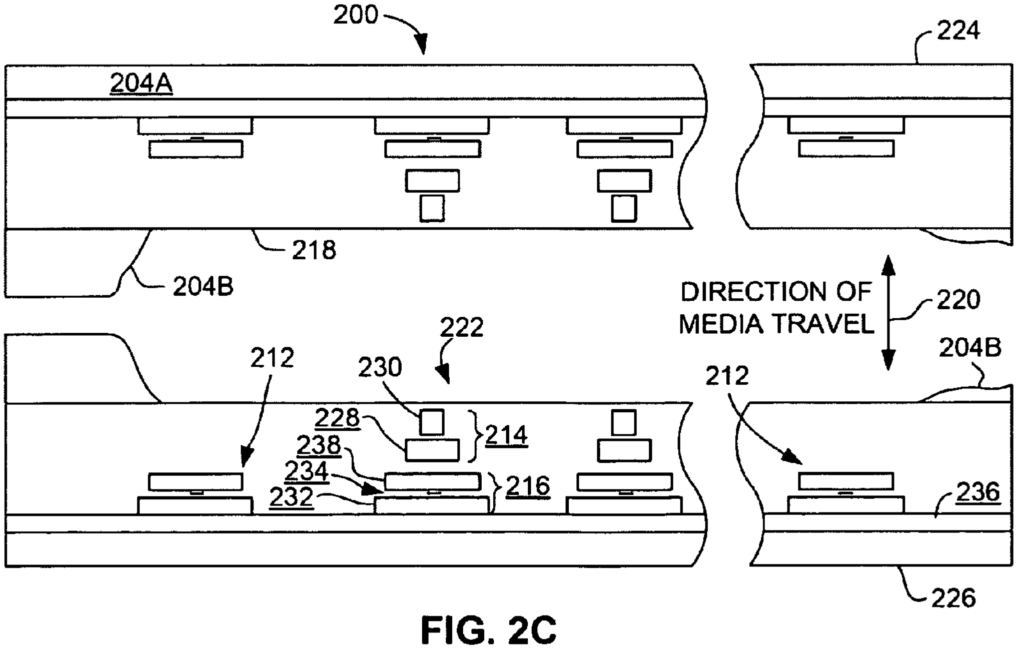
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the writer 214 and the readers, exemplified by the reader 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 3A:
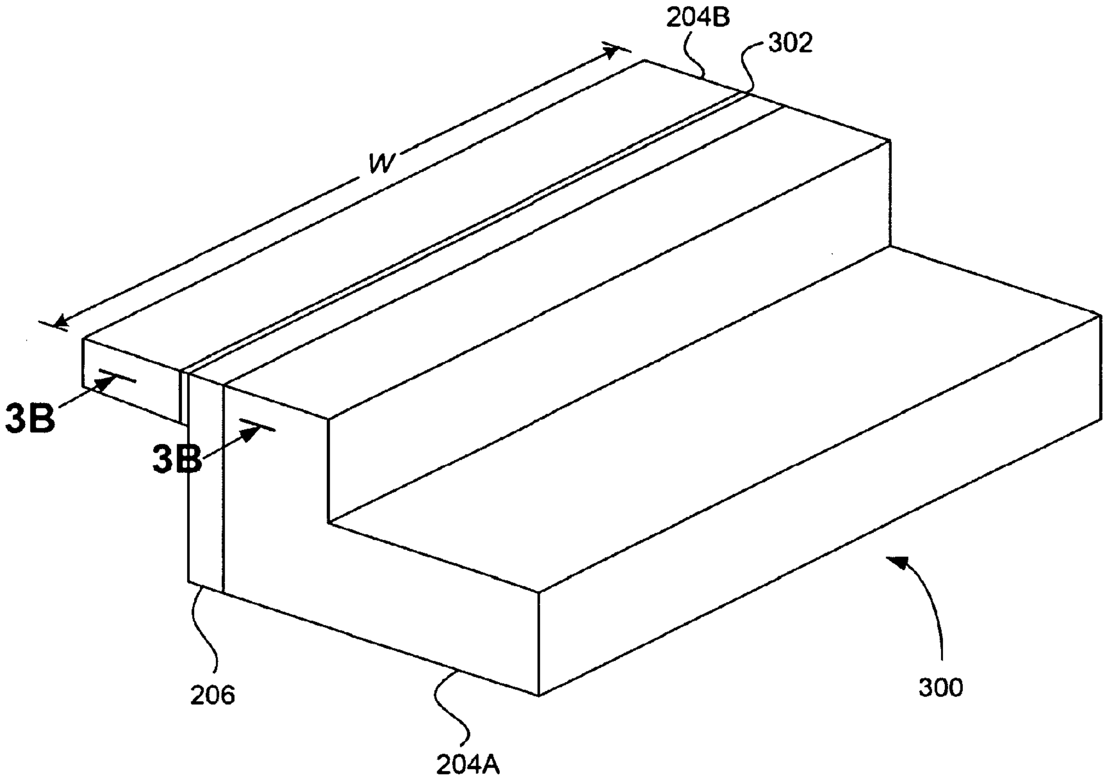
FIG. 3A is a schematic diagram of one half of a magnetic tape head having a full-span closure according to one embodiment.

FIG. 3A is a schematic diagram of one embodiment including a full span magnetic tape head module 300 with substrate 204A, thin film layer 206 comprising the transducers, adhesive layer 302, and closure 204B. In this arrangement, the thin film layer 206 and closure 204B would be electrically isolated from each other if an insulative adhesive were used. The thin film layer 206 can be grounded in the tape drive or elsewhere, but the closure 204B would be isolated. As tape runs along the surface of the magnetic tape head, the closure 204B can become significantly charged, possibly resulting in electrical potential difference between the closure 204B and substrate 204A of several 10s of volts. Such isolation may result in detrimental effects such as electrochemically driven plating of material from the tape onto portions of the TBS or removal of material from portions of the TBS. These physical effects have manifested themselves in problems such as shorting, alumina pitting, accumulation of adherent debris, etc. It can also lead to electrostatic discharge (ESD).

ESD damage to magnetic sensors used in the tape and hard disk (HDD) storage industries is a major issue. A potential for causing ESD damage to sensitive sensors is results from the creation of a potential difference between two different components within a device. For conductive materials which are bonded together, an adhesive which satisfies the mechanical bonding properties as well as forming an ESD dissipative connection is desirable.

To prevent potential differences between head components, an ESD dissipative adhesive is used to form the adhesive layer 302 in the embodiment shown. This has the effect of equalizing the charges between the closure 204B and substrate 204A without requiring an additional processing step of adding paint or other conductive path between the closure 204B and substrate 204A.

The adhesive chosen for this bonding in this and some other embodiments preferably has low outgassing and no corrosive agents (no fluxing agent). The adhesive is preferably such that motion of the relative levels at the TBS is restricted to the order 10 nm in some cases. The conductivity of the adhesive system is preferably such as to electrically connect the different portions at the TBS to the same electrical potential (voltage) while not high enough to result in shorting of the elements at the TBS if the adhesive near the TBS is removed and can redeposit on die TBS. For the closure bond, the thermal setting epoxy 3M 2290 was found to work well, with a curing temperature of about 190° C. and a time duration at about 190° C. of about 3 hours. Portions of this system are at the TBS, so highly conductive adhesive is detrimental, as will be described later. Furthermore, motion of the parts at the TBS is highly restricted to be below 10 nm is some cases. As will be described below, conductive particles such as carbon black can be added to the adhesive to give the appropriate conductivity while not substantially degrading the mechanical properties of the adhesive bond.

The commonly accepted range for an electrostatic dissipative material is between about $10^4$ and about $10^{11}\Omega$ (or between about $10^5$ and $10^{12}$ $\Omega$/sq surface resistivity). Preferred embodiments fall within this range, but may be higher or lower depending on the particular application.

As an option, the readers and or writers may be coupled to the substrate and/or closure using an ESD dissipative connection or high impedance connection, possibly of the type disclosed herein or another type.

Figure 3B:
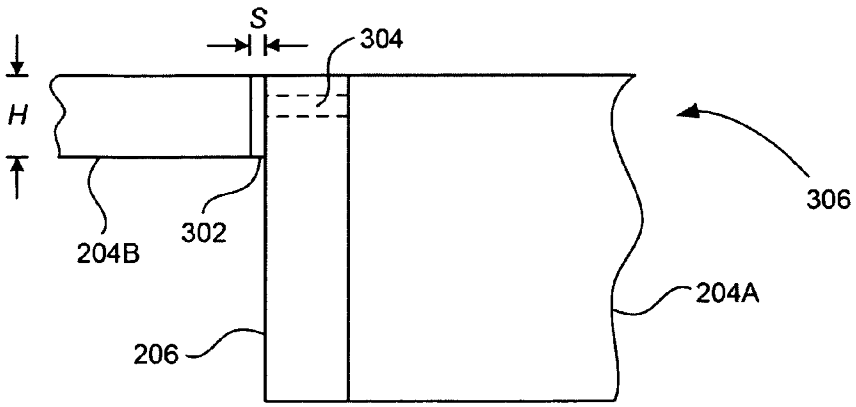
FIG. 3B is an enlarged side view of an area on FIG. 3A depicting a conductor element embedded in the thin film layer according to one embodiment.

FIG. 3B shows a conductor element 304 through the thin film layer 206 to create an electrical connection between the adhesive layer 302 and the substrate 204A. The adhesive layer 302 may consist of a mixture having an adhesive material with electrically conductive particles intermixed therein, the electrically conductive particles being present in an amount of between 0% and about 10% by weight of a total weight of the mixture. This allows any accumulated charge on the closure 204B to be passed through to other head components and ensures equipotential between the head components. The conductor element 304 between the adhesive layer 302 and the substrate 204A may be comprised of any conductive material, such as a metal (i.e., gold, silver, platinum, etc.), a conductive plastic, a conductive resin, etc.

In other embodiments, the conductor element 304 used to electrically connect the adhesive layer to the substrate 204A may be a conductive stud, a conductive bridge, a sputter-coated conductive patch, a raised substrate 204A portion which contacts the adhesive layer 302 after polishing the immediately overlying thin film layer 206 away, etc.

ESD dissipative adhesives in some embodiments may be made of commercially available adhesives commonly used for head component bonds by mixing the adhesive with an appropriate filler material, such as, but not limited to, carbon particulates, antimony doped Sn-oxide, and/or In:Sn:oxide.

Particularly preferred commercially available adhesives include Loctite 380, Loctite 4302, Loctite 4205 and Loctite 4303, available from Henkel Corporation, 1001 Trout Brook Crossing, Rocky Hill, Conn. 06067-3910, USA. Another particularly preferred commercially available adhesive is Scotch Weld 2290, available from 3M Corporation, 3M Corporate Headquarters, 3M Center, St. Paul, Minn. 55144-1000, USA.

In another approach, a special adhesive may be formulated specifically for the purpose of forming an ESD dissipative connection between different head components. Preferred adhesives include cyanoacrylates such as ethyl cyanocarylate.

Preferred adhesive mixtures have at least 40%, more preferably at least 50%, more preferably at least 60%, of a lap shear strength as measured in accordance with ISO 4587 after curing for 72 hours at 22° C. as the raw adhesive material has as measured in accordance with ISO 4587 after curing for 72 hours at 22° C. In one approach, the adhesive, when cured, has an electrical resistivity of at least about 100 ohm*cm.

In other approaches, the mixture has at least 50% of a lap shear strength as measured in accordance with ISO 4587 after curing for 6 to 24 hours at 22 to 70° C. or 1 to 6 hours at 190° C. as the raw adhesive material has as measured in accordance with ISO 4587 after curing for to 70° C. or 1 to 6 hours at 190° C.

For an adhesive bond having a separation S (as shown in FIG. 3B), height H (as shown in FIG. 3B), width W (as shown in FIG. 3A), and an adhesive resistivity ρ, the resistance of the electrostatically dissipative sheet (R) is given by Equation 1.

$$R = \frac{\rho \cdot S}{(H \cdot W)} \quad \text{Equation 1}$$

In FIG. 3B, current passes from substrate 204A to closure 204B through bond 302 and conductor 304.

Figure 4A:
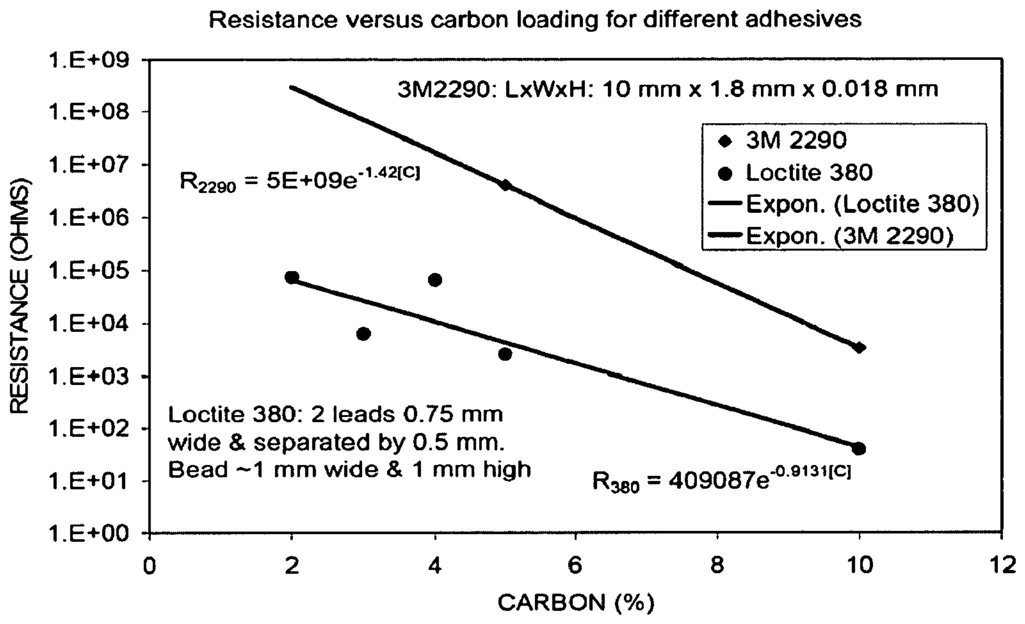
FIG. 4A is a plot of measured resistance versus percentage of carbon for 3M 2290 epoxy and Loctite 380 cyanoacrylate adhesive.
Figure 4B:
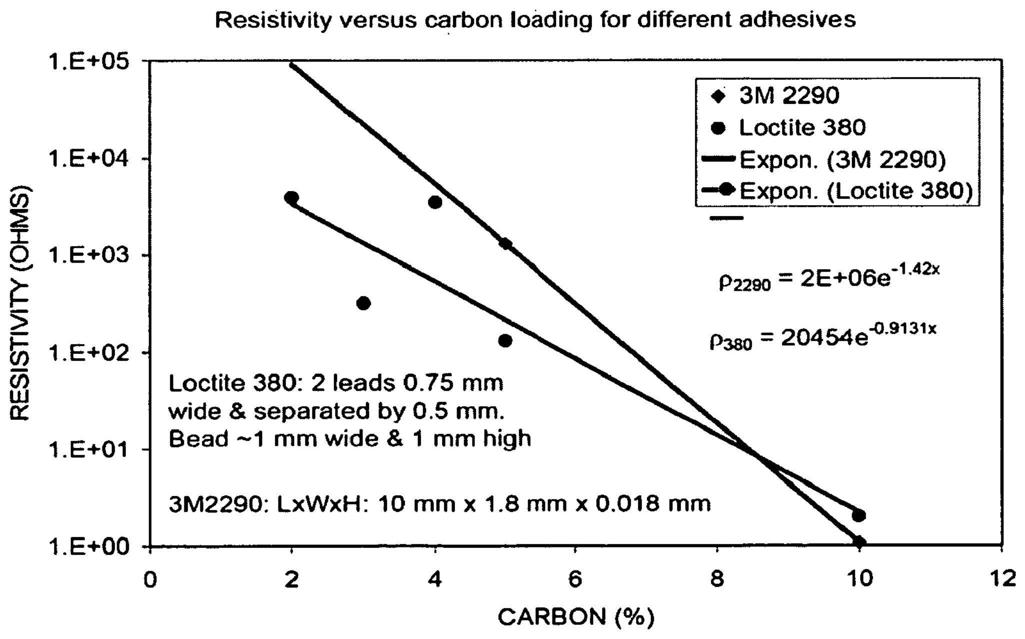
FIG. 4B is a plot of calculated resistivity versus percentage of carbon for 3M 2290 epoxy and Loctite 380 cyanoacrylate adhesive.

In an experimental approach, 3M 2290 adhesive and LOCTITE 380 (cyanoacrylate) adhesive can each be made either conductive or ESD dissipative by doping the bonding material with carbon black powder at levels between 0% and about 10% by weight. Once applied to the fixture, the carbon loaded, 1 part 3M 2290 epoxy was cured overnight at 70° C. The EC2290 dimensions were: 10 mm×1.8 mm×0.018 mm. For the Loctite 380 tests, the carbon loaded adhesive was spread in a 1 cm long line touching two parallel gold coated copper lines (0.75 mm in width and 0.5 mm apart). The Loctite 380 cyanoacrylate was cured overnight under nitrogen atmosphere. Resistance measurements were made with an HP 3468A multimeter. The results the tests are given in Table 1. Approximate resistivities are also given in Table 1. The resistivities for 3M 2290 are based on the dimensions given above and Equation 1. The resistivities for the Loctite 380 are more difficult to calculate, but were derived using Equation 1 for 3 resistors in series with respective values for L, W and H of: 0.8 mm×1 mm×1 mm for the end resistors and 0.5 mm×1 mm×1 mm for the center resistor. FIG. 4A is a plot of measured resistance and FIG. 4B of calculated resistivity versus percentage of carbon for 3M 2290 epoxy and Loctite 380 cyanoacrylate adhesive. The resistances can be fit with an exponential dependence on the percentage of carbon loading [C] given by Equation 2a for resistivity and 2b for resistance:

$$\rho = \rho_o \exp(-\alpha^* [C]). \quad \text{Equation 2a}$$

$$R = R_o \exp(-\alpha^* [C]). \quad \text{Equation 2b}$$

$R_o$ and α are constants. $R_o$ is related to the resistivity through the dimensions given by Equation 1. Because the dimensions are not always easily determined, Equation 2b can be used for practical purposes. Experimentally, $R_o$ and α for 3M 2290 are: $5 \times 10^9$ ohm and 1.4/%. $\rho_o$ is calculated to be about $1.6 \times 10^9$ ohm*cm. Experimentally, $R_o$ and α for Loctite 380 are: $4.1 \times 10^5$ ohm and 0.91/%. $\rho_o$ is calculated to be about 130 ohm*cm.

TABLE 1

Resistance values versus carbon loading for Loctite 380 and 3M 2290. Loctite 380: bead ~1 mm wide by 1 mm height connecting two 0.75 mm wide leads separated by 0.5 mm. 3M 2290: bead ~1.8 mm wide and 0.018 mm high connecting two flat leads separated by 10 mm.

| carbon (%) | Loctite 380 Resistance (ohms) | 3M 2290 Resistance (ohms) | Loctite 380 resistivity* (ohm cm) | 3M 2290 resistivity** (ohm cm) |
|---|---|---|---|---|
| 2 | 7.70E+04 | | 3850 | |
| 3 | 6400 | | 320 | |
| 4 | 68000 | | 3400 | |
| 5 | 2600 | 4.00E+06 | 130 | 1294 |
| 10 | 40 | 3300 | 2.0 | 1.0 |

*Resistivity is approximate using Equation 1 and assuming 3 series resistors

**Resistivity is calculated using Equation 1 and assuming an ideal rectangle.

Other commercially available adhesives that have desirable bonding properties (such as strength, cure-time, ability to prevent component movement, etc.) could also be used with this method by adding >0% to about 10% by weight of a conductive filler material to the bonding material. Illustrative conductive filler materials include, but are not limited to, carbon, antimony doped Sn-oxide, In:Sn:oxide, etc. and combinations thereof.

Manufacturers of commercially available adhesives strive for high conductivity values in order to achieve low resistance connections, of values of less than 100 ohms or under about 10 ohms, or even below 1 ohm. In the case of tape and HDD heads, it is desirable to electrically connect two conductive bodies using a relatively high resistance.

In the examples given above resistances between about 40 ohm and 80 kilo-ohm, or calculated resistivities between 2 and 3900 ohm-cm were made using Loctite 380 with between 2 to 10% carbon black additive and normal curing processes. In the above examples, resistances between about 3 kilo-ohm and 4 mega-ohm, or calculated resistivities between 1 and 1300 ohm-cm were made using 3M 2290 with between 5 to 10% carbon black additive and a 70° C. curing processes. Thus, both Loctite 380 and 3M 2290 can be clearly tuned to the desired resistivity ranges required for the different scenarios described in this text and beyond.

It should also be noted that the curing process of ESD dissipative adhesives comprising commercially-available adhesives may be altered from that recommended by the manufacturer. For example, the temperature for curing may be altered, UV light may be used, etc.

Figure 5:
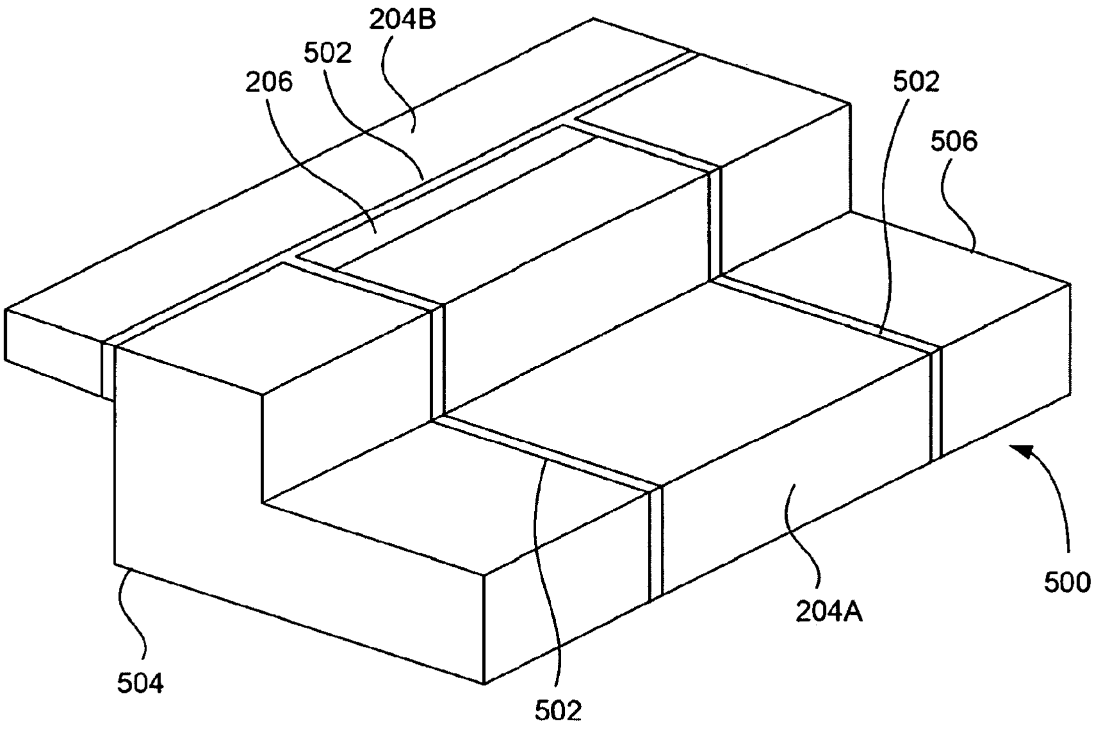
FIG. 5 is a schematic diagram of one half of a magnetic tape head having a full-span closure and side bars according to one embodiment.

FIG. 5 is a schematic diagram of one embodiment showing half of a magnetic head system 500 with side bars 504 and 506, substrate 204A, full span closure 204B, thin film layer 206, and adhesive layer 502. In this embodiment, the substrate 204A and thin film layer 206 are isolated from the closure 204B by the adhesive layer 502. Also, the thin film layer 206 and substrate 204A are flanked by side bars 504 and 506. These side bars 504 and 506 may be electrically connected with the closure 204B by use of an electrostatically dissipative adhesive material in the adhesive layer 502. The adhesive layer 502 may consist of a mixture having an adhesive material with electrically conductive particles intermixed therein, the electrically conductive particles being present in an amount of between 0% and about 10% by weight of a total weight of the mixture. Further, the side bars 504 and

506 may also be electrically connected to the substrate 204A through use of an electrostatically dissipative adhesive in the adhesive layer 502. In this embodiment, a conductor element 304 may be used between the adhesive layer 502 and the thin film layer 206, but equipotential between the head components is achieved without a conductor element 304 since the closure 204B is connected to the side bars 504 and 506 which are then connected to the substrate 204A through use of electrostatically dissipative adhesive in the adhesive layer 502. The substrate 204A is ultimately connected to the thin film layer 206 created equipotential between all head components.

As in an embodiment above, the magnetic head system 500 may include a conductor element, such as a conductive stud, wire, shunt, etc., electrically coupling the adhesive to the substrate.

In another approach, the thin film layer 206 may be part of a chiplet, the chiplet being coupled to the substrate 204A. The chiplet may also be coupled to the substrate 204A using an electrostatically dissipative adhesive.

The adhesive chosen for the bonding of FIG. 5, (and other embodiments) preferably exhibits low outgassing and no corrosive agents (no fluxing agent). The adhesive is preferably such that motion of the relative levels at the TBS is restricted to the order 10 nm in some cases. The conductivity of the adhesive system is also preferably such as to electrically connect the different portions at the TBS to the same electrical potential (voltage) while not high enough to result in shorting of the elements at the TBS if the adhesive near the TBS is removed and can redeposit on the TBS. For this bond, the thermal setting epoxy 3M 2290 was found to work, with a curing temperature of about 190° C. and a time duration at about 190° C. of about 3 hours. Portions of this system are at the TBS, so highly conductive adhesive is detrimental, as will be described later. Furthermore, motion of the parts at the TBS is highly restricted to be below 10 nm is some cases. As will be described below, conductive particles such as carbon black can be added to the adhesive to give the appropriate conductivity while not substantially degrading the mechanical properties of the adhesive bond.

In a further approach, the system 500 further comprises a beam (not shown) coupled to the substrate 204A, wherein the beam is coupled to a second beam using an electrostatically dissipative adhesive.

In yet another approach, the system 500 further comprises a drive mechanism for passing a magnetic recording medium over the thin film layer 206 and a controller electrically coupled to the thin film layer 206.

Figure 6:
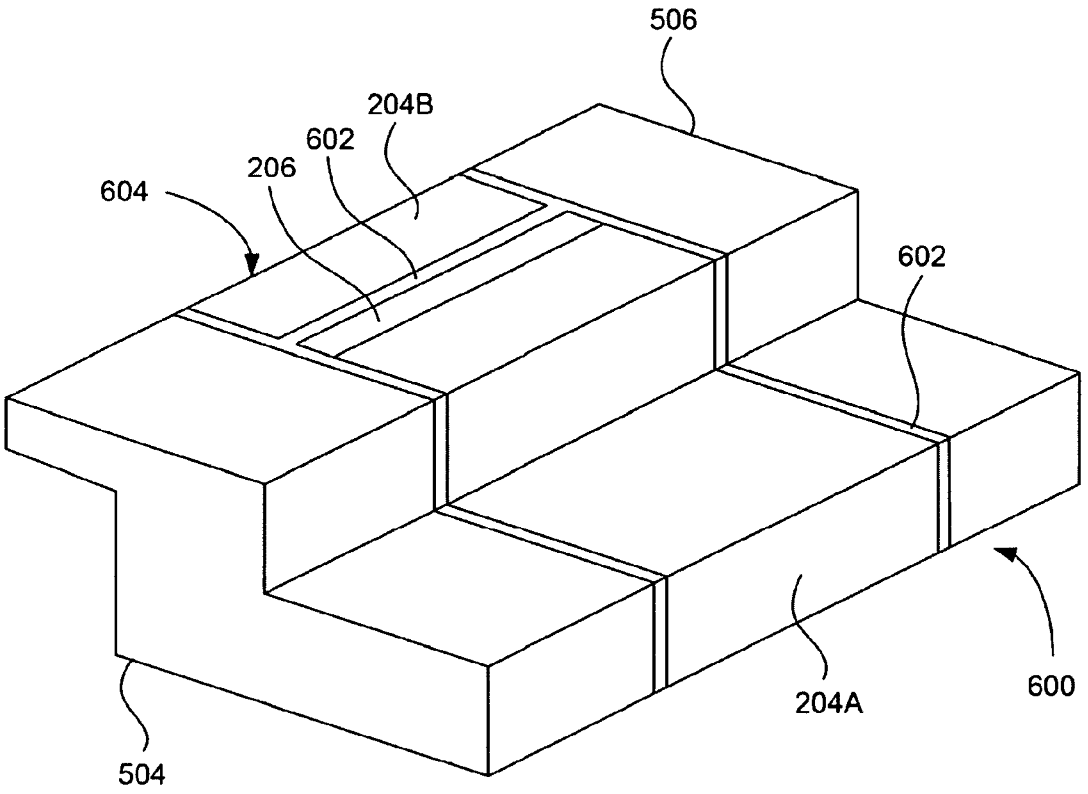
FIG. 6 is a schematic diagram of one half of a magnetic tape head having side bars according to one embodiment.

FIG. 6 is another embodiment showing half of a magnetic head system 600 featuring side bars 504 and 506 with a closure 204B. Here, the closure 204B is flanked on either side by the side bars 504 and 506, separated by the adhesive layer 602. The thin film layer 206 is also flanked by side bars 504 and 506 and separated by the adhesive layer 602. The adhesive layer 602 may consist of a mixture having an adhesive material with electrically conductive particles intermixed therein, the electrically conductive particles being present in an amount of between 0% and about 10% by weight of a total weight of the mixture. In this embodiment, a conductor element 304 may be used, but equipotential is achieved without using one since the side bars 504 and 506 may be connected with the closure 204B and the substrate 204A through use of an electrostatically dissipative adhesive layer 602. Since the substrate 204A is connected to the thin film layer 206, equipotential is achieved.

In this example, the adhesive layer 602 is at the TBS and will thus come in contact with the tape. The tape will remove some of the adhesive, which could then come in contact with the sensor and shield materials at the TBS. If the adhesive is designed to be highly conductive, then the conductive materials could cause shorting between the sensor and the associated shield across the thin gap region separating them. For this reason, it is best to use a dissipative adhesive for the bond.

For example, take an MR sensor having a resistance of 100 ohms, a width (W) of 1000 nm and separated from the metal shield by a distance of less than 100 nm. If an adhesive with a resistivity ρ fills the gap separating the sensor and shield to a height H of 100 nm, then Equation 1 gives the resistance bridging the two. If the bridging resistance is to shunt, say, less than about 0.1% of the current through the sensor, then the resistance of the bridging adhesive material should be of the order of >1000 times the sensor resistance, or 100 kiloohm. Under these assumptions, the adhesive resistivity should be >~100 ohm*cm. Using the data described above for 3M 2290, the percentage of carbon should be in the range of about 6.9% in one embodiment.

In another approach, the thin film layer 206 may be comprised of a chiplet, wherein the sidebars 504 and 506 are coupled to the chiplet, the substrate 204A, or both the chiplet and the substrate 204A. The chiplet may be coupled to these components through use of an electrostatically dissipative adhesive layer.

In another approach, the magnetic head system 600 further comprises a drive mechanism for passing a magnetic recording medium over the thin film layer 206 and a controller electrically coupled to the thin film layer 206.

Using FIG. 6 as an example, a method for fabricating a system can be described. As an option, the present method may be implemented in the context of the functionality and architecture of FIGS. 1-6. The method may also be carried out in any desired environment, and the aforementioned definitions may apply during the present description.

Now referring to FIG. 6, the closure 204B, which defines at least a portion of a tape bearing surface 604, is coupled to a thin film layer 206 or a substrate 204A, or both, by using an electrostatically dissipative adhesive layer 602. This adhesive may be comprised of a mixture including an adhesive material with electrically conductive particles intermixed therein. The electrically conductive particles could be present in an amount between 0% and about 10% by weight of a total weight of the mixture.

Figure 7:
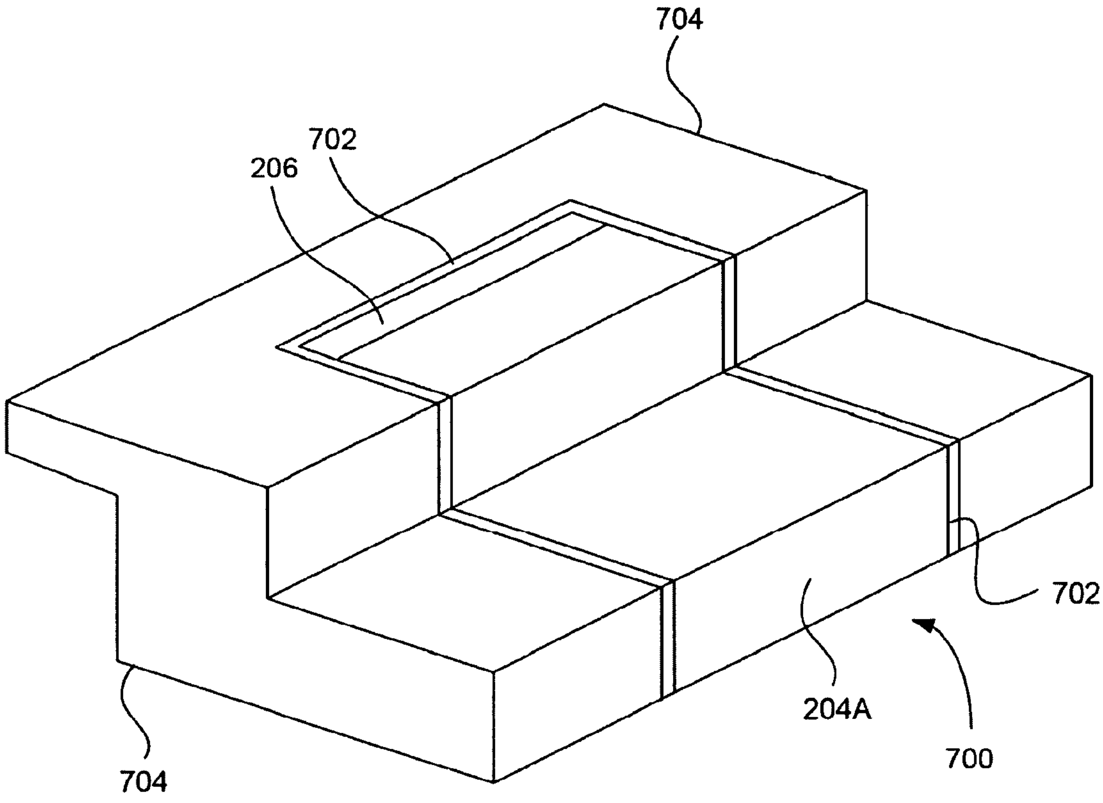
FIG. 7 is a schematic diagram of one half of a magnetic tape head having a continuous closure/side bar combination according to one embodiment.

FIG. 7 is an illustrative representation of another embodiment showing one half of a magnetic head system 700. In this figure, the side bars and closure form a single closure component 704 which wraps around the substrate 204A and thin film layer 206, but is separated from each by an adhesive layer 702. The adhesive layer 702 may consist of a mixture having an adhesive material with electrically conductive particles intermixed therein, the electrically conductive particles being present in an amount of between 0% and about 10% by weight of a total weight of the mixture. In this embodiment, equipotential can be achieved because the electrostatically dissipative adhesive layer 702 connects the closure component 704 with the substrate 204A, and ultimately the thin film layer 206. In this embodiment, a conductor element 304 may be used, but equipotential may be achieved without using one.

Referring again to FIG. 2, it is generally desirable to electrically connect the base (e.g., U-beam) 202 to the chip 204A. The U-beam 202 is typically dissipative, while the chip 204A is typically conductive. Accordingly, the U-beam 202 can be coupled to the chip 204A using an ESD dissipative adhesive or a conductive adhesive 240. A dissipative adhesive may be as described above. A conductive adhesive may, for example, have a conductivity higher than the commonly accepted range for ESD dissipative materials listed above, and may include a highly conductive material such as silver. In either approach, one particularly preferred commercially available adhesive material to be used in the mixture is Loctite 380, which was found to satisfy mechanical criteria of high bond strength, even with exposure to humidity. Further, the mixture containing Loctite 380 is curable in air at about ambient temperatures.

Preferably, the conductive adhesive has at least 50%, but preferably at least 75%, and more preferably at least 90% of a lap shear strength as measured in accordance with ISO 4587 after curing for 72 hours at 22° C. as the raw adhesive material (without the conductive material) has as measured in accordance with ISO 4587 after curing for 72 hours at 22° C.

For systems such as those shown in FIG. 2, excellent mechanical strength post curing as well as with exposure to humidity are preferred. The adhesive system preferably also has low outgassing and no corrosive agents (no fluxing agent) and also preferably cures at ambient conditions. One particularly preferred adhesive which worked for all of these purposes was Loctite 380. Addition of the conductive additive to Loctite 380 did not substantially alter these characteristics, as is desirable for any composition. The conductivity of the adhesive may be chosen for dual purposes. One is to make an electrical connection to the ESD dissipative substrate material. The second purpose is to electrically connect the portions of a composite described above. As described herein, conductive particles such as carbon black can be added to the adhesive to give the appropriate conductivity while not substantially degrading the mechanical properties of the adhesive bond.

While various embodiments have been described above, it should be understood that they have been presented by way of example only, and not limitation. Further, particular features described herein can be used in combination with other described features in each and any of the various possible combinations and permutations. Thus, the breadth and scope of a preferred embodiment should not be limited by any of the above-described exemplary embodiments, but should be defined only in accordance with the following claims and their equivalents.

What is claimed is:

1. An electrostatically dissipative adhesive, consisting of:

a mixture that provides electrostatic dissipation protection to at least one of read transducers and write transducers, the mixture consisting of:

an adhesive material, wherein the adhesive material is ethyl cyanoacrylate; and electrically conductive particles intermixed with the adhesive material, wherein the particles are selected from a group consisting of antimony doped Sn-oxide and In:Sn:oxide, the electrically conductive particles being present in an amount between greater than 0 and about 10% by weight of a total weight of the mixture, wherein the mixture has at least 90% of a lap shear strength as measured in accordance with ISO 4587 after curing for 72 hours at 22° C. as the raw adhesive material has as measured in accordance with ISO 4587 after curing for 72 hours at 22° C., wherein the adhesive, when cured, has an electrical resistivity of at least about 100 ohm*cm, wherein the adhesive, when cured, has an electrostatically dissipative surface resistivity in a range of between about $10^5$ and $10^{12}$ Ω/sq, with the proviso that the mixture contains no corrosive agents.

2. A system, comprising:

a substrate;

a thin film structure coupled to the substrate, the thin film structure comprising at least one of magnetic read transducers and write transducers;

a cable electrically coupled to the thin film structure; and the electrostatically dissipative adhesive as recited in claim 1 overlying the cable near a point of coupling of the cable to the thin film structure.

* * * * *